(12) United States Patent
Jerez et al.

(10) Patent No.: US 8,796,649 B2
(45) Date of Patent: Aug. 5, 2014

(54) ION IMPLANTER

(71) Applicants: Manuel A. Jerez, Roosevelt, NY (US); Carlos F. Borges, Roslyn Estates, NY (US)

(72) Inventors: Manuel A. Jerez, Roosevelt, NY (US); Carlos F. Borges, Roslyn Estates, NY (US)

(73) Assignee: ion Technology Solutions, LLC, Mineola, NY (US)

( * ) Notice: Subject to any disclaimer, the term of this patent is extended or adjusted under 35 U.S.C. 154(b) by 23 days.

(21) Appl. No.: 13/689,148

(22) Filed: Nov. 29, 2012

(65) Prior Publication Data

US 2014/0145581 A1    May 29, 2014

(51) Int. Cl.
*H01J 37/317* (2006.01)
*H01L 21/265* (2006.01)
*H01J 27/08* (2006.01)
*H01J 1/88* (2006.01)
*H01J 7/26* (2006.01)

(52) U.S. Cl.
CPC . *H01J 27/08* (2013.01); *H01J 1/88* (2013.01); *H01J 7/26* (2013.01)
USPC .................. 250/492.21; 250/423 R; 250/428; 250/454.11; 250/443.1

(58) Field of Classification Search
USPC ......... 250/492.21, 423 R, 428, 454.11, 443.1
See application file for complete search history.

(56) References Cited

U.S. PATENT DOCUMENTS

| | | | |
|---|---|---|---|
| 5,389,793 A * | 2/1995 | Aitken et al. | 250/492.21 |
| 6,559,454 B1 * | 5/2003 | Murrell et al. | 250/423 R |
| 2012/0252195 A1* | 10/2012 | Jones et al. | 438/514 |

* cited by examiner

*Primary Examiner* — Nikita Wells
(74) *Attorney, Agent, or Firm* — Francis C. Hand; Carella, Byrne, et al

(57) ABSTRACT

The support and electrode assemblies of the ion implanter are cooled by circulating a coolant through these parts during operation. The support for the arc chamber includes a one piece block of aluminum through which coolant passes and a hollow rectangular post on which the arc chamber sits with a space therebetween.

16 Claims, 7 Drawing Sheets

ION IMPLANTER

This invention relates to an ion implanter. More particularly, this invention relates to an ion implanter having an ion generating source that emits ions to form an ion beam for beam treatment of a workpiece or faces in a workpiece processing tool.

BACKGROUND OF THE INVENTION

Ion implantation is a process used to dope impurity ions into a semiconductor substrate. During the process, an ion beam is directed from an ion source chamber toward a substrate. The depth of implantation into the substrate is based on the ion implant energy and mass of the ions generated in the source chamber. A precise doping profile in the substrate is critical to proper device operation. One or more types of ion species may be implanted in different doses and at different energy levels to obtain desired device characteristics.

During implantation or other workpiece processing, accelerated ions will sputter materials off any impinged surface eroding the surface.

An ion implanter generally includes an ion source chamber to which power is supplied to a source which is configured to generate ions of a particular species. The generated ions are extracted from the source through a series of electrodes (extraction electrode assembly) and formed into a beam which passes through a mass analyzer magnet. The mass analyzer itself is configured with a particular magnetic field such that only the ions with a desired mass-to-charge ratio are able to travel through the analyzer for maximum transmission through a mass resolving slit. Ions of the desired species pass from the slit through a deceleration stage. During this time, the neutral, lighter and heavier ions will be stopped on graphite walls inside of the mass analyzer.

An indirectly heated cathode (IHC) ion source is typically used as the ion source chamber in high current applications. Such an ion source includes an arc chamber defined by electrically conductive (e.g. tungsten) chamber walls. The chamber defines an ionization zone within which energy is imparted to a dopant feed gas to generate associated ions. Different feed gases are supplied to the ion source chamber to obtain plasma used to form ion beams having particular dopant characteristics. For example the introduction of $H_2$, $BF_3$, $GeF_4$, $PH_3$, and $AsH_3$ as the dopant gas at relatively high chamber temperatures are broken down into mono-atoms having low, medium and high implant energies. These ions are formed into a beam, which then passes through a source filter. The source filter is preferably located near the ion source. The ions within the beam are accelerated/decelerated in a column to the desired energy level. A mass analyzer magnet having an aperture is used to remove unwanted components from the ion beam, resulting in an ion beam having the desired energy and mass characteristics passing through a resolving aperture.

An IHC ion source chamber generally includes a cathode/filament assembly located at one end of the arc chamber. The filament is usually positioned in close proximity to the cathode from outside the arc chamber. A voltage is supplied to filament which produces enough current through the filament to heat the filament and to cause thermionic emission of electrons. The cathode is indirectly heated via the filament by biasing the cathode more positively than the filament which causes these thermo-electrons to accelerate from the filament toward the cathode, thereby heating the cathode. A repeller is typically positioned on the opposite end of the arc chamber and is biased to the same voltage as the cathode. The emitted electrons are confined between the cathode and repeller which collide with the dopant feed gas introduced into the chamber via a conduit to generate a plasma having the desired properties.

During operation, the ions formed from the dopant gas are extracted from the source chamber via an aperture by way of, for example, a standard three (3) electrode configuration comprising a plasma electrode, a suppression electrode and a ground electrode used to create an electric field. The electrodes are physically in contact with each other via insulators. The plasma electrode may be biased at the same large potential as the ion source chamber. The suppression electrode is connected to a power supply and is typically biased at a moderate negative value to prevent electrons from entering back into the source chamber. The ground electrode is positioned downstream from the suppression electrode and is a ground potential. The strength of the electric field generated by the electrodes can be tuned to a desired beam current to extract a particular type of ion beam from the ions generated in the chamber. An extraction electrode to control the beam divergence would typically be below the potential of the suppression electrode for a low energy beam and above the potential of the suppression electrode for a high energy beam.

Ion sources that generate the ion beams used in existing implanters are typically called arc ion sources and can include heated filament cathodes for creating ions that are shaped into an appropriate ion beam for wafer treatment. U.S. Pat. No. 5,497,006 includes an ion source having a cathode and antcathode (repeller) disposed in a gas confinement chamber. The ion source further includes a solid aluminum block for retaining the gas confinement chamber with a support portion of a base. The cathode of the U.S. Pat. No. 5,497,006 is a tubular conductive body and end cap that partially extends into a gas confinement chamber. A filament is supported within the tubular body and emits electrons that heat the end cap through electron bombardment, thermionically emitting the ionizing electrons into a gas confinement chamber.

U.S. Pat. No. 5,763,890 also discloses an arc ion source for use in an ion implanter. The ion source includes a gas confinement chamber having conductive chamber walls that bound a gas ionization zone. The gas confinement chamber includes an exit opening to allow ions to exit the chamber. A base positions the gas confinement chamber relative to structure for forming an ion beam from ions exiting the gas confinement chamber.

U.S. Patent Application 2011/0156570 also discloses a cathode assembly for use in an ion implanter. The ion source includes a gas confinement chamber having a filament clamp assembly. The filament clamp assembly has a pair of bifurcate clamps to hold the connecting leads of a filament within a cavity of a cathode of a separate cathode assembly. The filament clamp assembly is mounted on an insulator block in self-aligning relation. The cathode assembly has a tungsten cathode with an internal cavity to receive the filament that is secured within a retainer shield made of tungsten, molybdenum and graphite by a threaded graphite cylindrical collar.

Other sources may drive RF, microwave or electron beam discharges to generate desired ions. These sources generate plasma densities 10-100 times lower than arc ion sources and are typically used with source materials that have low ionization potentials (species that are easy to ionize) or when the source chamber includes large ion extraction areas. Cold ion sources, such as shown in U.S. Pat. No. 6,975,072, can have source materials made of relatively low temperature materials, such as stainless steel, copper or aluminum. However, hot ion sources, such as arc ion sources, expose the source chamber walls to an arc plasma of a temperature of several tens of thousands of degrees Celsius and high thermal power densities. As a result, the hot source components of prior art implanters require the source materials to be made of high temperature materials, i.e. so called refractory materials, such as molybdenum, tantalum or tungsten.

Accordingly, it is an object of the invention to provide an ion source assembly constructed to improve the life performance during ion beam operation.

It is another object of the present invention to reduce the number of parts in constructing an ion source assembly.

It is another object of the present invention to improve cooling of the ion source base of an ion implanter.

It is another object of the present invention to reduce ion implanter downtime.

Briefly, the invention is directed to an ion implanter that includes a support, a cover assembly, an arc chamber post, an arc chamber, an electrode assembly for the arc chamber and an electrode assembly for the cover assembly.

In accordance with the invention, the support and electrode assemblies of the ion implanter are cooled by circulating a coolant through these parts during operation.

In addition, structures are provided to reduce material deposition or flaking that may otherwise lead to short circuiting during operation. In one respect, an anti-cathode of the arc chamber is mounted in the arc chamber with a tortuous gap to prevent short circuits and plasma leak from the arc chamber. In another respect, a tubular shield is provided to prevent formation of a conductive coating on the insulator ring of the anti-cathode.

In another respect, the cover assembly is constructed with a pair of insulators each of which is provided with a mount that acts as a shielding cover to protect the insulators from metallic deposition during operation. The cover assembly also has a graphite extraction electrode with a slit secured across the mounts such that the mounts serve to align the slit in the extraction electrode with a slit for passage of a beam in the arc chamber.

These and other objects and advantages of the invention will become more apparent from the following detailed description taken in conjunction with the accompanying drawings wherein.

Figure 1:
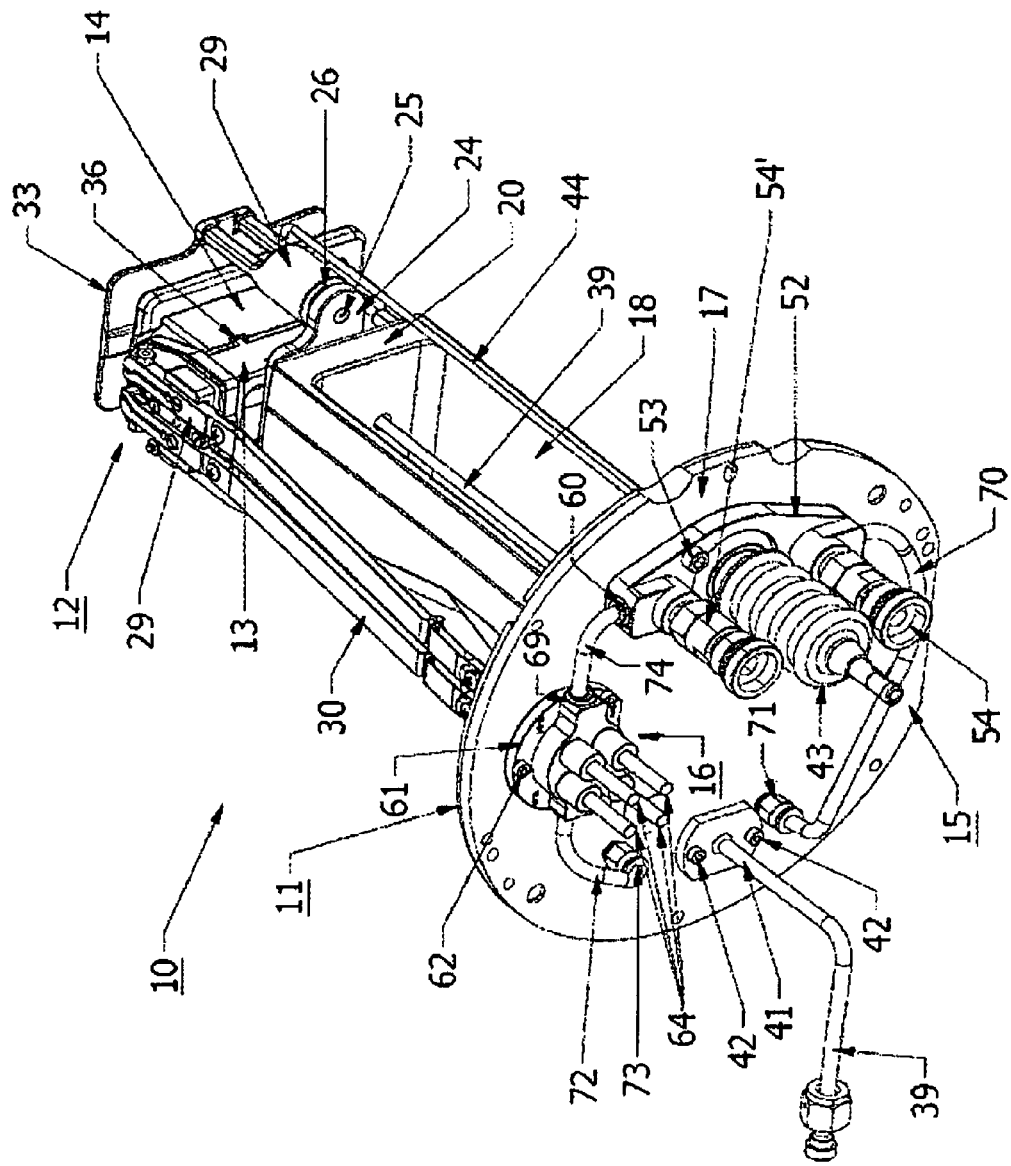
FIG. 1 illustrates a perspective view of an ion implanter assembly for an ion implanter in accordance with the invention.

Referring to FIG. 1, the ion implanter assembly 10 for an ion implanter includes a one piece support 11, a cover assembly 12, an arc chamber post 13, a plasma arc chamber 14, and an electrode assembly 15 for the cover assembly 12 and an electrode assembly 16 for the arc chamber 14.

Figure 6:
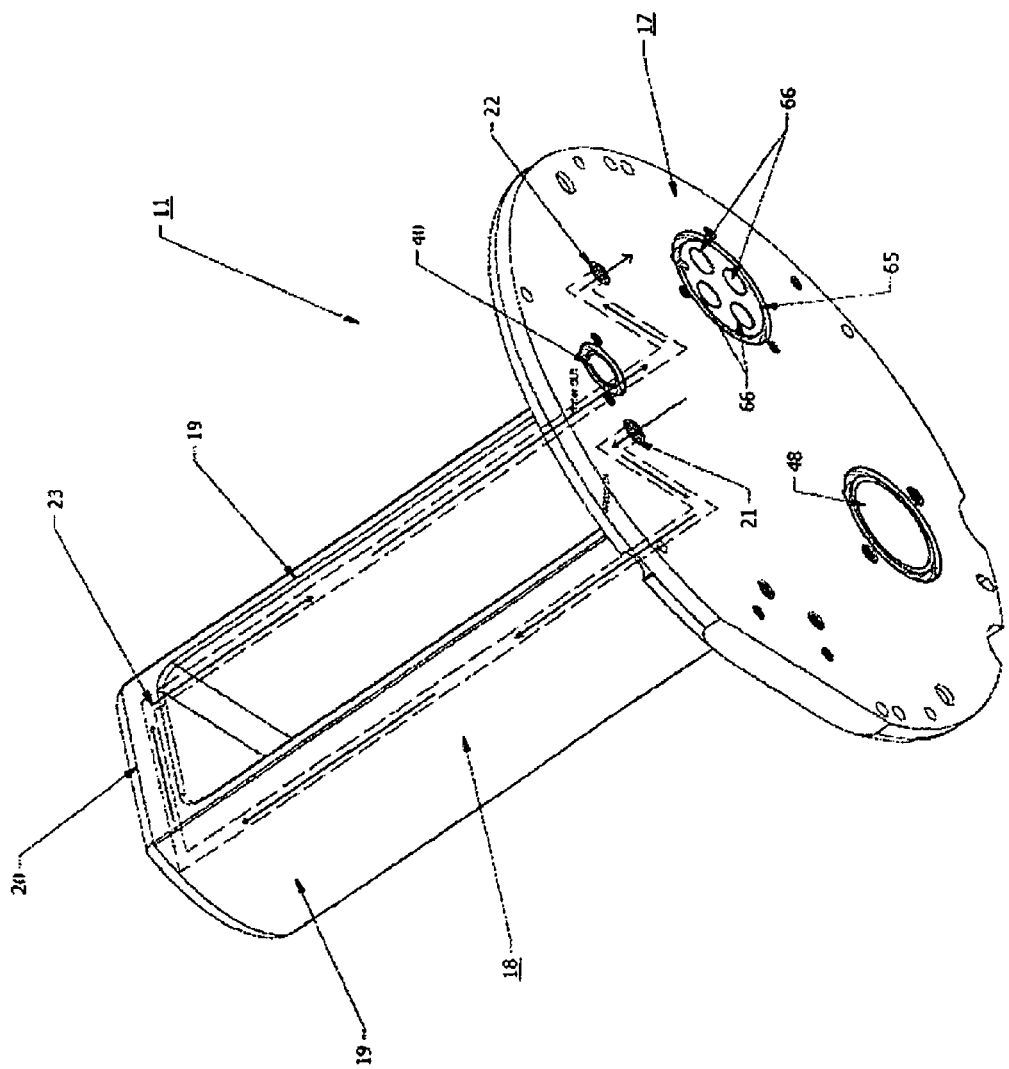
FIG. 6 illustrates a perspective view of the one piece support of FIG. 1.

Referring to FIGS. 1 and 6, the one piece support 11 has a flange 17 and a skeletal block 18 extending perpendicularly from the flange 17 to support the arc chamber post 13. As illustrated, the skeletal block 18 is of U-shape with a pair of parallel legs 19 extending from the flange 17 and a base 20 opposite and parallel to the flange 17. The support 11, preferably constructed from aluminum, is constructed to reduce the heat on the aluminum support 11 during ion beam operation.

The flange 17 is of circular shape and may also have handles (not shown) by which the arc chamber 14 may be removed from the implanter assembly 10. Typically, the electrode assembly 10 is constructed to be mounted with a vertical orientation but may also be mounted in a horizontal plane or any angular orientation.

The flange 17 has an inlet 21 for a flow of coolant and an outlet 22 for an outflow of the coolant while the skeletal block 18 has a longitudinally extending channel 23 communicating with the inlet 21 and the outlet 22 to conduct a flow of coolant therebetween. The channel 23 extends within each leg 19 and the base 20 of the block 18.

Figure 2:
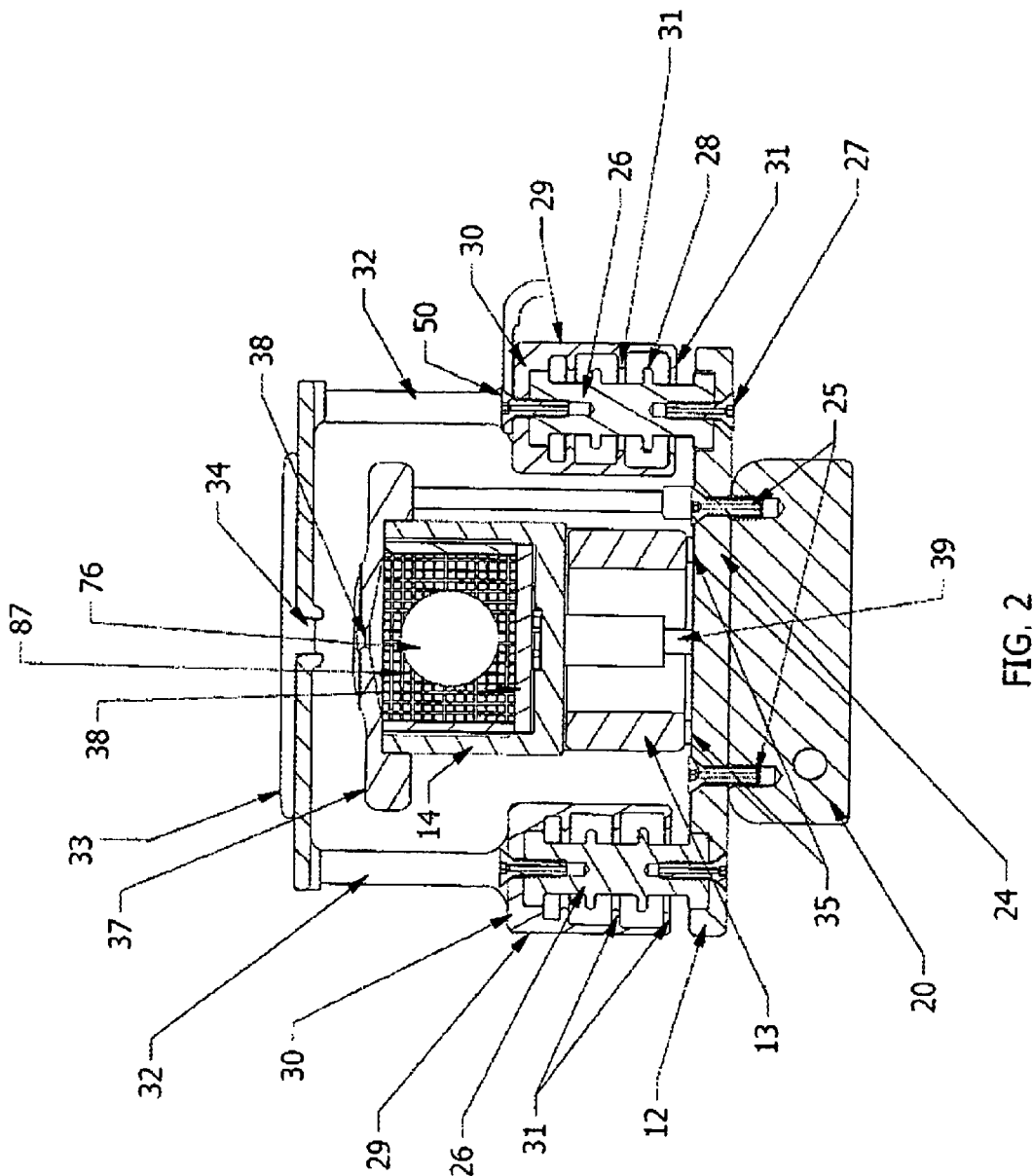
FIG. 2 illustrates a part cross-sectional perspective view of a support, arc chamber post, arc chamber and cover assembly of the assembly of FIG. 1.

Referring to FIGS. 1 and 2, the cover assembly 12 has a plate 24 secured to and across the base 20 of the skeletal block 18 of the support 11. As indicated in FIG. 2, the plate 24 is secured to the base 20 by two or more screws 25.

Referring to FIG. 2, the cover assembly 12 also has a pair of insulators 26 of alumina mounted on opposite sides of the plate 24 with each insulator 26 being secured by a screw 27 to the plate 24. Each insulator 26 has a plurality of longitudinally spaced apart external ribs 28.

In addition, a pair of electrically conductive mounts 29 are provided on the insulators 26. Each mount 29 has an annular cap 30 secured to and surrounding an insulator 26, a plurality of longitudinally spaced apart internal ribs 31 disposed in alternating spaced apart relation with the ribs 28 of an insulator 26 and a pair of parallel posts 32 extending perpendicularly from the cap 30.

Each mount 29 acts as a shielding cover to protect the insulator 26 from metallic deposition during operation. In addition, the ribs 31 of each mount 29 create a long path to reduce metallic deposition which might otherwise cause a short circuit and shut down the arc chamber 14.

A graphite extraction electrode 33 of flat shape is secured to and across the parallel posts 32 of each mount 29, as by screws, and has an elongated slit 34 centrally disposed therein.

The cover assembly 12 is light weight and provides self-aligning and centering capabilities for the graphite extraction electrode 33.

Figure 3:
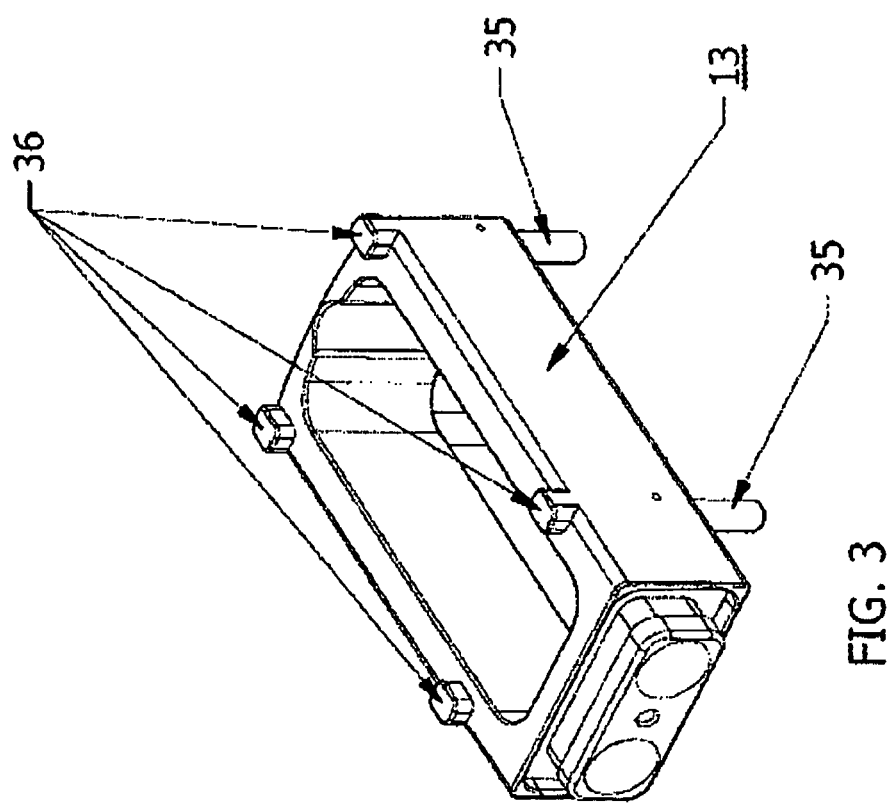
FIG. 3 illustrates a perspective view of the arc chamber post of FIG. 2.

Referring to FIG. 3, the arc chamber post 13 is of hollow rectangular box shape and has a plurality of projecting depending posts 35 mounted on the plate 24 of the cover assembly 12 (see FIG. 2) and a plurality of projections 36 on the opposite upper side to support the arc chamber 14 in spaced relation therefrom (see FIG. 1).

As illustrated in FIGS. 1 and 2, the arc chamber post 13 is disposed between the two mounts 29 of the cover assembly 12.

Referring to FIG. 2, the plasma arc chamber 14 is mounted on the arc chamber post 13 for generating an ion beam and has a cover 37 with an elongated slit 38 in alignment with the slit 34 of the extraction electrode 33 for passage of the ion beam therethrough.

The plasma arc chamber 14 may be constructed in any suitable manner such as described in co-pending U.S. patent application Ser. No. 13/649,564, filed Oct. 11, 2012 and/or co-pending U.S. patent application Ser. No. 13/649,652, filed Oct. 11, 2012.

Referring to FIG. 1, a gas line 39 extends through the flange 17 of the support 11 and centrally of the base 20 of the skeletal block 18 to pass through the plate 24 of the cover assembly 12 to supply gas to the plasma arc chamber 14. As illustrated in FIG. 6, a passage 40 is provided in the flange 17 for the gas line 39. A cover plate 41 is secured, as shown, to the underside of the flange 17 by two bolts 42 to secure the gas line 39 in place.

Figure 7:
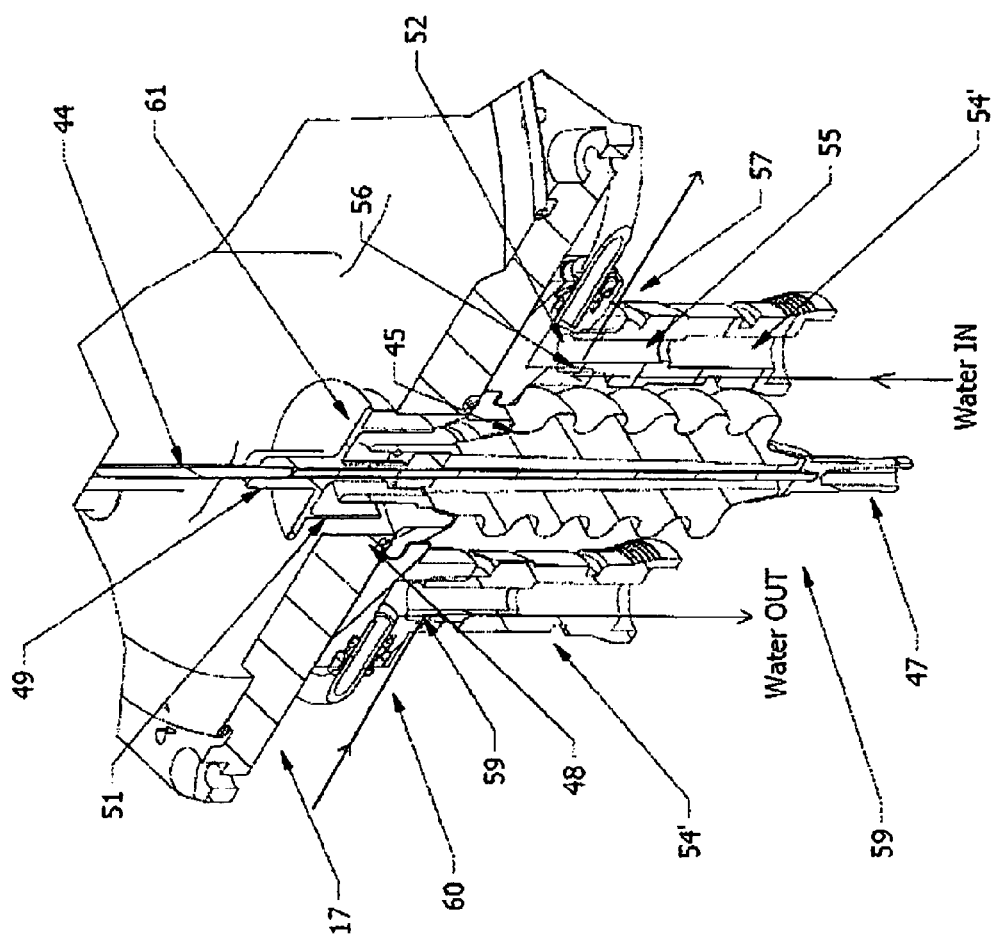
FIG. 7 illustrates a part cross-sectional perspective view of the electrode assembly for the cover assembly with coolant passages in accordance with the invention.

Referring to FIGS. 1 and 7, the electrode assembly 15 for the graphite extraction electrode 33 of the cover assembly 12 has a high voltage feedthrough 43 mounted in the flange 17 of the support 11 and a high temperature, high purity conductor 44, for example, of refractory metal, that extends from the feedthrough 43 to one of the electrically conductive mounts 29.

Referring to FIG. 7, the feedthrough 43 includes a mounting collar 45 that is hermetically sealed to a ceramic insulator 46 that depends, as shown, from the collar 45 on the underside of the flange 17 and to which the conductor 44 is mounted via a welded connection 47. The flange 17 is also provided with a passage 48 for the insulator 46.

As illustrated, in FIG. 7, a shielding cover 49 is disposed about the conductor 44 adjacent the flange 17 and in facing relation to the plasma arc chamber 14 to protect against sputtered material from the arc chamber 14. This cover 49 is secured to the conductor 44, for example, by a set screw (not shown) in a conventional manner. As shown in FIG. 2, the opposite end of the conductor 44 is secured by a screw 50 to the cap 30 between the two posts 32 to deliver a voltage thereto.

The shielding cover 49 includes a depending skirt 51 that surrounds the insulator 46 is spaced relation to protect the upper end of the insulator from deposition of sputtered material.

Referring to FIGS. 1 and 7, a coolant assembly is provided for cooling the electrode assembly 15. This coolant assembly has a plate 52 secured, as shown, to the underside of the flange 17 by bolts 53 (only one of which is shown) and concentrically of the feedthrough 43. As indicated the plate 52 is apertured to surround the collar 45 and to clamp the collar 45 to the flange 17 thereby securing the feedthrough 43 in place.

Referring to FIG. 7, the coolant assembly also has two stubs 54, 54' for passing coolant to and from the plate 52. The inlet stub 54 is connected to an inlet 55 of a channel 56 in the plate 52 to deliver coolant to the channel 56. As indicated, the channel 56 has an outlet 57 in the plate 52 to expel coolant. The outlet stub 54' is connected to an inlet 58 of a channel 59 in the plate 52 to deliver coolant to the channel 59. As indicated, the channel 59 has an outlet 60 in the plate 52 to expel coolant.

Figure 5:
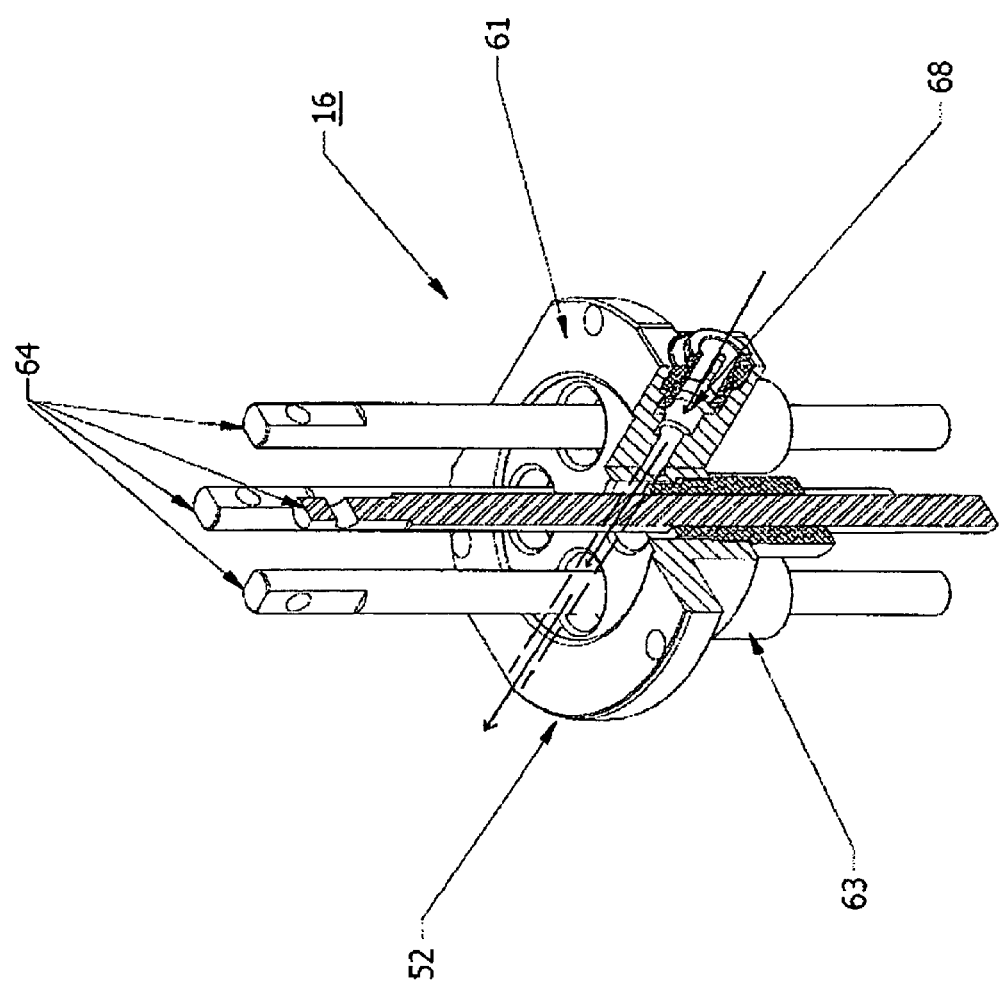
FIG. 5 illustrates a part sectional perspective view of the electrode assembly for the arc chamber with coolant passages in accordance with the invention.

Referring to FIGS. 1 and 5, the electrode assembly 16 for the arc chamber 14 has a plate 61 secured to the flange 17 of the support 11 as by bolts 62, a plurality of insulators 63 secured in spaced apart parallel relation within the plate 61 and a plurality of electrodes 64, for example, of copper, each of which is secured to and passes through a respective insulator 63. As shown, the insulators 63 and electrodes 64 number four.

As indicated in FIG. 6, a circular recess 65 is provided, as shown, in the underside of the flange 17 to receive the plate 61 and four passages 66 are provided in the recess 65 for passage of the electrodes 64.

Referring to FIGS. 1 and 5, a coolant assembly is provided for cooling the electrode assembly 16. This coolant assembly employs an inlet 67 in the plate 61 of the electrode assembly 16 for a flow of coolant into the plate 61, a channel 68 in communication with the inlet 67 that extends through the plate 61 to an outlet 69 (see FIG. 1) in the plate 61.

As shown in FIG. 1, a line 70 connects the outlet 57 from the plate 52 of the electrode assembly 15 for the graphite extraction electrode 33 to the inlet 21 (see FIG. 6) to the channel 23 in the skeletal block 18 of the support 11 via a suitable connection 71. In addition, a line 72 connects the outlet 22 from the channel 23 in the skeletal block 18 via a suitable connection 73 to the inlet 67 in the plate 61 of the electrode assembly 16 for the arc chamber 14. Also, a line 74 connects the outlet 69 in the plate 61 to the inlet 60 in the plate 52 of the electrode assembly 15.

The lines 70, 72 and 74 complete a coolant circuit through the one piece support 11, the plate 52 of the high voltage feedthrough 43 of the electrode assembly 15 for the graphite extraction electrode 33 and the plate 61 of the electrode assembly 16 for the arc chamber 14.

These specific cooling features provided in the above construction significantly reduce the temperature on the aluminum support 11 created when an ion beam is operating.

Referring to FIG. 1, the electrodes 64 of the electrode assembly 16 are connected to the plasma arc chamber 14 in a manner as described in co-pending U.S. patent application Ser. No. 13/649,652, filed Oct. 11, 2012, the disclosure of which is incorporated by reference. Also, the filament clamp assembly and cathode assembly are constructed as described in US2011/0156570.

Figure 4:
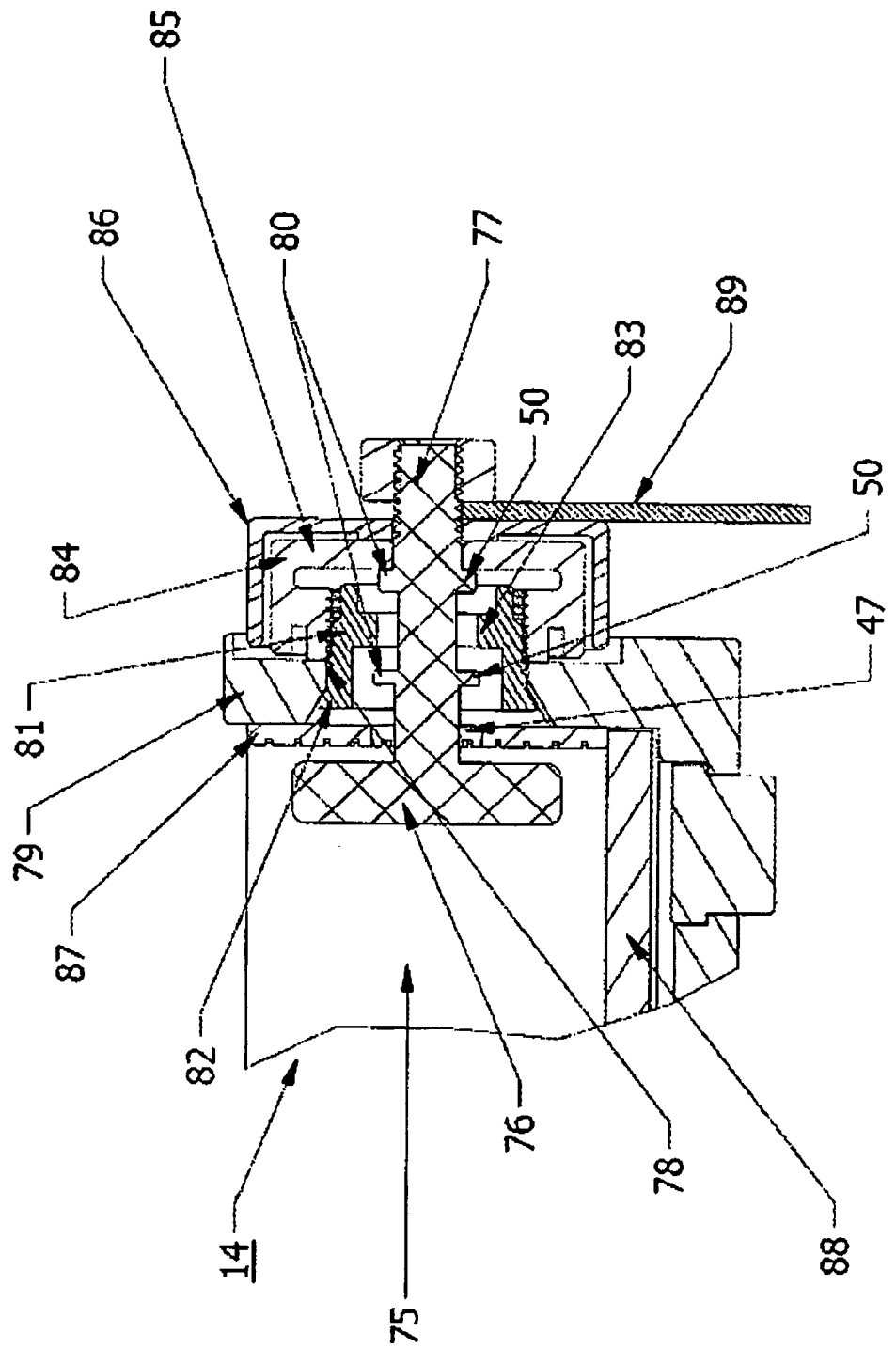
FIG. 4 illustrates a sectional view of a repeller assembly of the arc chamber of FIG. 2.

Referring to FIG. 4, the arc chamber 14 includes an anti-cathode (repeller) 75 that has an enlarged knob-like body 76 at one end within the arc chamber 14 and an integral stem 77 that passes through an opening 78 in an end wall 79 of the arc chamber 14. As indicated, the stem 77 has a pair of radially outstanding collars 80 thereon.

In addition, a tubular shield 81 is mounted in the opening 78 of the end wall 79 concentrically of the stem 77. The shield 81 has an outwardly directed flange 82 at one end of larger diameter than the opening 78 to abut the end wall 79 and at least one radially inwardly directed rib 83 disposed between the collars 80 of the stem 77.

An insulator ring 84 is threaded onto the tubular shield 81 and abutted against the end wall 79. The ring 84 has a disk like end 85 that abuts the outer collar 80 on the stem 77 to close off a plasma path from the arc chamber 14 through the end wall 79. As indicated, the insulator ring 84 surrounds the stem 77 to define a tortuous gap between the stem 77 and each of the opening 78, tubular shield 81 and insulator ring 84.

A lock nut 85 is threaded onto an end of the stem 77 and into abutment with the insulator ring 84 to hold the anti-cathode (repeller) 75 in cantilevered relation within the arc discharge chamber 14.

A graphite cover 86 is provided about the insulator ring 84 and stem 77 to prevent material deposition and a liner 87 of square pattern to prevent flakes during operation that may otherwise cause a short circuit is provided between the end wall 79 of the arc chamber 14 and the knob-like body 76. Interchangeable tungsten liners 88 on the side walls and bottom of the arc chamber 14 serve to prevent plasma contamination from the walls.

A cathode strap 89 is fitted between the cover 86 and the nut 85 and connects with the electrical feed to the filament clamp assembly as described in co-pending U.S. patent application Ser. No. 13/649,652.

The invention thus provides an ion source assembly constructed to improve the life performance during ion beam operation and that reduces the number of parts required for constructing an ion source assembly.

The invention further provides for an improvement in the cooling of the ion source support of an ion implanter.

The invention provides for a reduction in ion implanter downtime due to short circuiting within the arc chamber.

What is claimed is:

1. An ion implanter comprising
a one piece support having a flange including an inlet for a flow of coolant and an outlet for an outflow of the coolant and a skeletal block extending perpendicularly from said flange and having a channel communicating with said inlet and said outlet to conduct a flow of coolant therebetween, said channel and extending longitudinally of said skeletal block;
a first electrode assembly having a high voltage feedthrough mounted in said flange and a conductor extending from said feedthrough; and
a first coolant assembly for cooling said first electrode assembly having a plate secured to said flange concentrically of said feedthrough and having an inlet stub in said plate for a flow of coolant, a first outlet in said plate, a first channel extending through said plate from said inlet stub to said first outlet, a first inlet in said plate for a flow of coolant, an outlet stub in said plate and a second channel extending from said first inlet to said outlet stub to expel coolant therefrom.

2. An ion implanter as set forth in claim 1 further comprising a shielding cover disposed about said conductor adjacent said flange.

3. An ion implanter as set forth in claim 1 further comprising a second electrode assembly having a plate secured to said flange, a plurality of insulators secured in spaced apart parallel relation within said plate and a plurality of electrodes, each said electrode being secured to and passing through a respective one of said plurality of insulators; and
a second coolant assembly for cooling said second electrode assembly and having an inlet for a flow of coolant in said plate of said second electrode assembly, a bore in communication with said latter inlet extending through said plate of said second electrode assembly and an outlet in said plate of said second electrode assembly in communication with said bore to expel coolant therefrom.

4. An ion implanter comprising
a one piece support having a flange including an inlet for a flow of coolant and an outlet for an outflow of the coolant and a skeletal block extending perpendicularly from said flange and having a channel communicating with said inlet and said outlet to conduct a flow of coolant therebetween, said channel and extending longitudinally of said skeletal block;
an electrode assembly having a plate secured to said flange, a plurality of insulators secured in spaced apart parallel relation within said plate and a plurality of electrodes, each said electrode being secured to and passing through a respective one of said plurality of insulators; and
a coolant assembly for cooling said electrode assembly and having an inlet for a flow of coolant in said plate of said second electrode assembly, a bore in communication with said latter inlet extending through said plate of said second electrode assembly and an outlet in said plate of said second electrode assembly in communication with said bore to expel coolant therefrom.

5. An ion implanter comprising
a one piece support having a flange and a skeletal block extending perpendicularly from said flange;
a cover assembly having a plate secured to and across said skeletal block, a pair of insulators mounted on opposite sides of said plate, each said insulator having a plurality of longitudinally spaced apart ribs thereon, a pair of electrically conductive mounts, each said mount having an annular cap secured to and surrounding a respective one of said pair of insulators, a plurality of longitudinally spaced apart internal ribs disposed in alternating spaced apart relation with said ribs of said respective one of said pair of insulators and a pair of parallel posts extending perpendicularly from said cap, and a graphite extraction electrode of flat shape secured to and across said parallel posts of each said mount and having an elongated slit therein for passage of an ion beam.

6. An ion implanter as set forth in claim 5 further comprising
an arc chamber post of hollow rectangular box shape having a plurality of projecting posts mounted on said plate of said cover assembly and a plurality of projections, said arc chamber post being disposed between said pair of mounts of said cover assembly;
a plasma arc chamber mounted on said projections of said arc chamber post for generating an ion beam and having a cover with an elongated slit in alignment with said slit of said extraction electrode for passage of the ion beam therethrough; and
a gas line extending through said flange centrally of said skeletal block and through said plate of said cover assembly to said plasma arc chamber.

7. An ion implanter comprising
a cover assembly having a plate, a pair of insulators mounted on opposite sides of said plate, each said insulator having a plurality of longitudinally spaced apart ribs thereon, a pair of electrically conductive mounts, each said mount having an annular cap secured to and surrounding a respective one of said pair of insulators, a plurality of longitudinally spaced apart internal ribs disposed in alternating spaced apart relation with said ribs of said respective one of said pair of insulators and a pair of parallel posts extending perpendicularly from said cap, and a graphite extraction electrode of flat shape secured to and across said parallel posts of each said mount and having an elongated slit therein for passage of an ion beam;
an arc chamber post of hollow rectangular box shape having a plurality of projecting posts mounted on said plate of said cover assembly and a plurality of projections, said arc chamber post being disposed between said pair of mounts of said cover assembly; and
a plasma arc chamber mounted on said projections of said arc chamber post for generating an ion beam and having a cover with an elongated slit in alignment with said slit of said extraction electrode for passage of the ion beam therethrough.

8. An ion implanter comprising
a one piece support having a flange including an inlet for a flow of coolant and an outlet for an outflow of the coolant and a skeletal block extending perpendicularly from said flange and having a channel communicating with said inlet and said outlet to conduct a flow of coolant therebetween, said channel and extending longitudinally of said skeletal block;
a cover assembly having a plate secured to and across said skeletal block, a pair of insulators mounted on opposite sides of said plate, each said insulator having a plurality of longitudinally spaced apart ribs thereon, a pair of electrically conductive mounts, each said mount having an annular cap secured to and surrounding a respective one of said pair of insulators, a plurality of longitudinally spaced apart ribs disposed in alternating spaced apart relation with said ribs of said respective one of said pair of insulators and a pair of parallel posts extending perpendicularly from said cap, and a graphite extraction electrode of flat shape secured to and across said parallel posts of each said mount and having an elongated slit therein;

an arc chamber post of hollow rectangular box shape having a plurality of projecting posts mounted on said plate of said cover assembly and a plurality of projections, said arc chamber post being disposed between said pair of mounts of said cover assembly;

a plasma arc chamber mounted on said projections of said arc chamber post for generating an ion beam and having a cover with an elongated slit in alignment with said slit of said extraction electrode for passage of the ion beam therethrough;

a gas line extending through said flange centrally of said skeletal block and through said plate of said cover assembly to said plasma arc chamber:

a first electrode assembly having a high voltage feedthrough mounted in said flange, a conductor extending from said feedthrough to one of said electrically conductive mounts and a shielding cover disposed about said conductor adjacent said flange in facing relation to said plasma arc chamber;

a first coolant assembly for cooling said first electrode assembly having a plate secured to said flange concentrically of said feedthrough and having an inlet stub in said plate for a flow of coolant, a first outlet in said plate, a first channel extending through said plate from said inlet stub to said first outlet, a first inlet in said plate for a flow of coolant, an outlet stub in said plate and a second channel extending from said first inlet to said outlet stub to expel coolant therefrom;

a second electrode assembly having a plate secured to said flange, a plurality of insulators secured in spaced apart parallel relation within said plate and a plurality of electrodes, each said electrode being secured to and passing through a respective one of said plurality of insulators; and a second coolant assembly for cooling said second electrode assembly and having an inlet for a flow of coolant in said plate of said second electrode assembly, a bore in communication with said latter inlet extending through said plate of said second electrode assembly and an outlet in said plate of said second electrode assembly in communication with said bore to expel coolant therefrom.

9. An ion implanter as set forth in claim 8 wherein said first outlet in said plate of said first coolant assembly is in communication with said inlet in said flange of said one piece support, said outlet in said flange of said one piece support is in communication with said inlet of said second coolant assembly and said outlet of said second coolant assembly is in communication with said first inlet in said plate of said first coolant assembly whereby a coolant circuit is formed for passing coolant through said first coolant assembly, said skeletal block of said one piece support and said second coolant assembly.

10. A one piece support for an ion implanter comprising
a flange including an inlet for a flow of coolant and an outlet for an outflow of the coolant; and
a skeletal block extending integrally and perpendicularly from said flange and having a channel communicating with said inlet and said outlet to conduct a flow of coolant therebetween, said channel and extending longitudinally of said skeletal block.

11. A one piece support as set forth in claim 10 made of aluminum.

12. In combination
an arc chamber having an end wall and an opening in said end wall;
a knob-like body within said arc chamber;
a stem integral with said body and passing through said opening, said stem having at least a pair of radially outstanding collars thereon;
a tubular shield mounted in said opening of said end wall concentrically of said stem, said shield having at least one radially directed rib disposed between said collars of said stem;
an insulator ring threaded onto said tubular shield and abutted against said end wall, said ring having a disk like end that abutting a respective one of said collars on said stem to close off a plasma path from said arc chamber through said end wall; and
a lock nut threaded onto said stem into abutment with said insulator ring.

13. The combination as set forth in claim 12 further comprising a graphite cover about said insulator ring and said stem to prevent material deposition.

14. The combination as set forth in claim 12 further comprising a graphite liner of square pattern between said end wall of said arc chamber 14 and said knob-like body.

15. The combination as set forth in claim 14 wherein said arc chamber comprises side walls and a bottom and which further comprises a plurality of interchangeable tungsten liners on said side walls and said bottom of said arc chamber.

16. An ion implanter comprising
a one piece support having a flange and a skeletal block extending perpendicularly from said flange;
a plasma arc chamber mounted on said support;
an electrode assembly having a high voltage feedthrough mounted in said flange and a conductor extending from said feedthrough; and
a shielding cover is disposed about said conductor adjacent said flange and in facing relation to said plasma arc chamber to protect against sputtered material from said arc chamber.

* * * * *